(12) United States Patent
Blonigan et al.

(10) Patent No.: US 7,007,919 B2
(45) Date of Patent: Mar. 7, 2006

(54) SLIT VALVE METHOD AND APPARATUS

(75) Inventors: Wendell Blonigan, Union City, CA (US); Emanuel Beer, San Jose, CA (US); Dongchoon Suh, Santa Clara, CA (US); Jaime Munoz, Los Gatos, CA (US); Sam H. Kim, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 57 days.

(21) Appl. No.: 10/418,682

(22) Filed: Apr. 17, 2003

(65) Prior Publication Data

US 2004/0206921 A1    Oct. 21, 2004

(51) Int. Cl.
*F16K 3/16* (2006.01)

(52) U.S. Cl. .................... 251/113; 251/193
(58) Field of Classification Search ............... 251/89, 251/102, 104, 105, 110, 111, 112, 113, 158, 251/167, 193, 195, 203, 204
See application file for complete search history.

(56) References Cited

U.S. PATENT DOCUMENTS

| | | | |
|---|---|---|---|
| 2,471,885 A | | 5/1949 | Mueller |
| 3,722,857 A | * | 3/1973 | Townsend ................ 251/203 |
| 4,483,509 A | * | 11/1984 | Lewcock et al. ........... 251/112 |
| 4,721,282 A | | 1/1988 | Lobianco et al. |
| 4,785,962 A | | 11/1988 | Toshima |
| 4,921,213 A | | 5/1990 | Geiser |
| 4,957,018 A | * | 9/1990 | Jakubiec et al. ............. 251/89 |
| 5,002,255 A | | 3/1991 | Sawa et al. |
| 5,116,023 A | | 5/1992 | Contin |
| 5,226,632 A | | 7/1993 | Tepman et al. |
| 5,275,303 A | | 1/1994 | Szalai |
| 5,363,872 A | | 11/1994 | Lorimer |
| 5,820,104 A | | 10/1998 | Koyano et al. |
| 6,032,419 A | | 3/2000 | Hurwitt |
| 6,045,117 A | * | 4/2000 | Tamura et al. ............. 251/113 |
| 6,089,543 A | | 7/2000 | Freerks |
| 6,129,044 A | | 10/2000 | Zhao et al. |
| 6,192,827 B1 | | 2/2001 | Welch et al. |
| 6,254,328 B1 | | 7/2001 | Wytman |
| 6,375,746 B1 | | 4/2002 | Stevens et al. |

FOREIGN PATENT DOCUMENTS

EP        0 453 867 A1    10/1991

* cited by examiner

*Primary Examiner*—Eric Keasel
(74) *Attorney, Agent, or Firm*—Dugan & Dugan

(57) ABSTRACT

An actuator assembly for a slit valve door is configured to maintain a slit valve in a closed condition notwithstanding a high pressure differential between adjacent chambers that the slit valve isolates from each other. The slit valve door actuator assembly includes an actuator which moves the slit valve door between open and closed positions, and a locking mechanism to keep the slit valve door in a position to seal the slit valve in resistance to high gas pressure against the slit valve door. The locking mechanism may include a hard stop which is selectively movable into position to block retracting movement of the slit valve door.

14 Claims, 6 Drawing Sheets

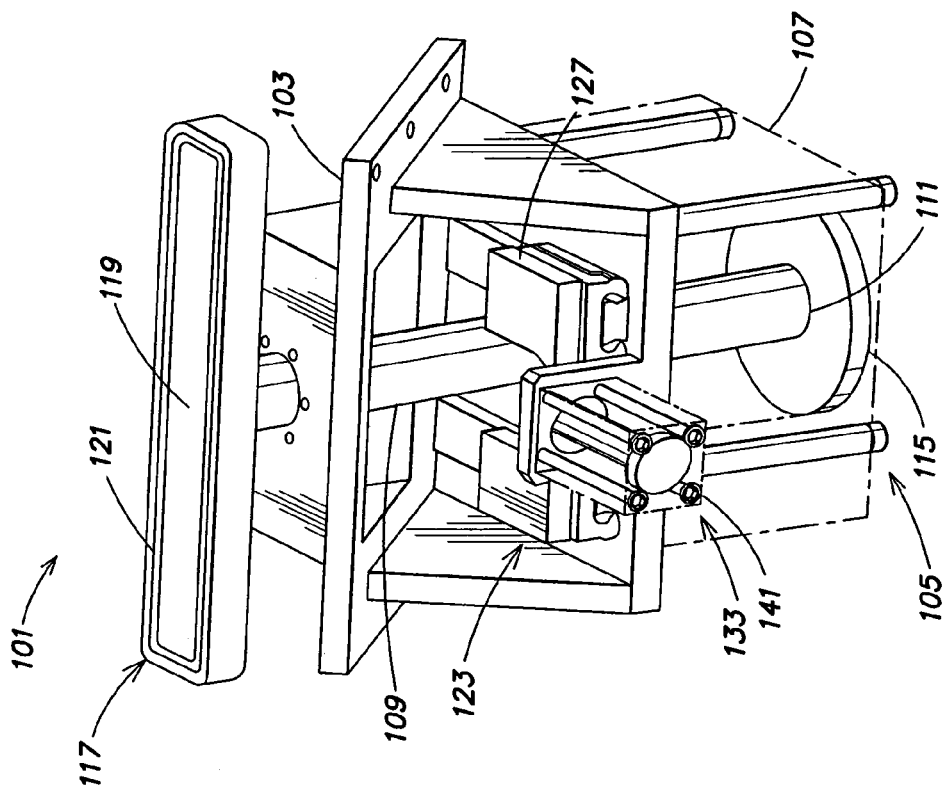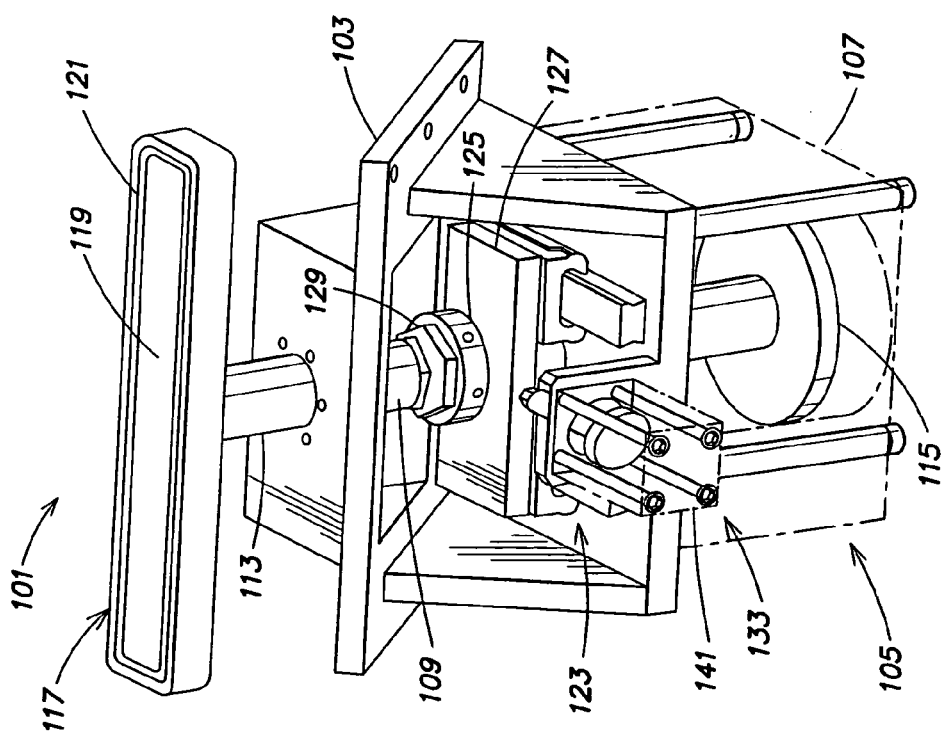

SLIT VALVE METHOD AND APPARATUS

FIELD OF THE INVENTION

This invention is generally concerned with processing systems used for processing substrates, and is more particularly concerned with actuating a slit valve door which seals a slit valve opening between two chambers in a vacuum processing system.

BACKGROUND OF THE INVENTION

Conventional techniques for manufacturing flat panel displays or semiconductor devices entail applying a sequence of processes to a substrate such as a glass plate or a silicon wafer. The processes to be applied may include thermal processing, physical vapor deposition (PVD), chemical vapor deposition (CVD), etching, etc. Typically, each process in the sequence of processes is performed in a respective processing chamber. Accordingly, the substrates upon which the processes are performed must be transferred from one processing chamber to another.

It is also conventional to incorporate a number of different processing chambers in a single processing tool, wherein the processing chambers are coupled along the periphery of a central transfer chamber. FIG. 1 is a schematic side view of a conventional processing tool 11. The processing tool 11 includes a centrally-positioned transfer chamber 13. A load lock chamber 15 and a processing chamber 17 are shown coupled to respective sides of the transfer chamber 13. One or more additional processing chambers and/or load lock chambers, which are not shown, may also be coupled to respective sides of the transfer chamber 13. The load lock chamber 15 is provided to accommodate introduction of substrates into the processing tool 11 from outside the processing tool 11.

The transfer chamber 13 includes a main body 19 having side walls 21 (of which only two are visible in FIG. 1). Each side wall 21 may be adapted to have a load lock or processing chamber coupled thereto. The transfer chamber 13 also includes a top 23 supported on the main body 19. A lid 25 is provided to sealingly close the top 23 of the transfer chamber 13.

A lower end of the transfer chamber 13 is closed by a substantially annular bottom 27. The bottom 27 of the transfer chamber 13 has a central aperture 29 which accommodates installation of a substrate handling robot 31 in the transfer chamber 13. The substrate handling robot 31 is adapted to transfer substrates among the processing chambers 17 and the load lock chamber or chambers 15 coupled to the transfer chamber 13.

To minimize the possibility of contamination of substrates processed in the processing tool 11, it is customary to maintain a vacuum in the interior of the transfer chamber 13. Hence, the processing tool 11 may be referred to as a vacuum processing system. A pumping system, which is not shown, may be coupled to the transfer chamber 13 to pump the transfer chamber 13 down to a suitable degree of vacuum.

Also illustrated in FIG. 1 is an actuator 33 which selectively opens and closes a slit valve 35 associated with the processing chamber 17. When the slit valve 35 is in an open position (not shown), a substrate may be introduced into or removed from the processing chamber 17. When the slit valve 35 is in the closed position illustrated in FIG. 1, the processing chamber 17 is isolated from the transfer chamber 13 so that a fabrication process may be performed on a substrate within the processing chamber 17.

FIG. 2 is a schematic vertical cross-sectional view showing on a larger scale the slit valve 35 and associated actuator 33 of the processing tool 11. The slit valve 35 is adapted to selectively seal a passage 37 which, when the slit valve 35 is in an open condition (not shown) communicates between the transfer chamber 13 and the processing chamber 17. The passage 37 terminates at a slit-shaped opening 39 on the processing chamber side of the passage 37, and terminates in a slit-shaped opening 41 on the transfer chamber side of the passage 37.

A door seating surface 43 surrounds the opening 41 and may be part of the sidewall 21 of the transfer chamber 13. In accordance with a known practice, the door seating surface 43 defines a plane which is inclined at an angle (e.g., 45°) from a path (indicated by arrow 45) by which a substrate (not shown) is transferred through the passage 37. A slit valve door 47 is mounted on a second end 49 of an actuator shaft 51 that is part of the actuator 33. The slit valve door 47 is adapted to selectively seal against the seating surface 43 so as to gas-tightly isolate the processing chamber 17 from the transfer chamber 13. In particular, the slit valve door 47 may include an O-ring (not separately shown) to form a seal between the slit valve door 47 and the door seating surface 43. The sealing position of the slit valve door 47 is indicated in solid lines in FIG. 2. The actuator 33 is operable to retract the slit valve door 47 to a position shown in phantom and indicated as 53. When the slit valve 47 is in its retracted position 53, the slit valve 35 is in an open condition, and the passage 37 is not obstructed by the slit valve door 47, so that a substrate may be transferred between the transfer chamber 13 and the processing chamber 17.

The conventional slit valve arrangement may also include a bellows (not shown so as to simplify the drawing) which is connected between the second end 49 of the actuator shaft 51 and the bottom 27 of the transfer chamber 13. The bellows may be provided to seal around the actuator shaft 51.

As noted above, it is customary to maintain a vacuum pressure in the transfer chamber 13 during processing operations. A process which may be performed in the processing chamber 17, such as chemical vapor deposition or etching, may call for maintaining a high pressure (e.g., 5 atmospheres) in the processing chamber 17 during processing. In order to maintain isolation between the transfer chamber 13 and the processing chamber 17 while a high pressure process is performed in the processing chamber 17, it is necessary that the slit valve door 47 be held against the sealing surface 43 with a force sufficient to resist the force exerted in an outward direction (i.e., from the processing chamber 17 toward the transfer chamber 13) by the pressurized gas in the processing chamber 17.

As the dimensions of the processing tool 11 are increased to accommodate processing of larger substrates, the size of the slit valve door 47 is increased, and of particular concern in the present instance, the surface area of the slit valve door 47 exposed to the passage 37 is increased. Consequently, the effective force applied by the pressurized gas in the processing chamber 17 against the slit valve door 47 is increased. The increase pressure experienced by the slit valve door 47 leads to a need to increase the force with which the slit valve door 47 is held against the door sealing surface 43. To provide such an increased sealing force, it could be contemplated to increase the size of the actuator 33. However, space considerations may make it impractical to increase the size of the actuator 33. Furthermore, if the slit valve door 47 is pressed against the sealing surface 43 with the increased force (e.g., at a time when the processing chamber 17 is not pressurized), the O-ring which is intended to seal between the slit valve door 47 and the door sealing surface 43 may be compressed to such a degree that metal-to-metal contact may occur between the slit valve door 47 and the door sealing surface 43. Such metal-to-metal contact may generate particles, which may adversely affect the devices processed within the processing tool 11.

SUMMARY OF THE INVENTION

According to an aspect of the invention, a slit valve door is movable by an actuator between a position in which the slit valve door seals a slit valve opening and a position in which the slit valve door does not obstruct the opening. A locking mechanism is associated with the actuator to limit movement of the slit valve door away from the slit valve opening. The locking mechanism is sufficiently robust to hold the slit valve door in a sealing position relative to the slit valve opening, notwithstanding a force exerted against the slit valve door by a high gas pressure in a processing chamber coupled to the slit valve opening.

With the locking mechanism (e.g., a hard stop) provided in accordance with the invention, the slit valve door may be held in position against a door sealing surface in a manner so as to withstand the high pressure present within the processing chamber, without requiring a larger slit valve door actuator, and without requiring compression of a compressible member such as an O-ring to such a degree that metal-to-metal contact may occur between the slit valve door and the door sealing surface.

Further features and advantages of the present invention will become more fully apparent from the following detailed description of exemplary embodiments, the appended claims and the accompanying drawings.

BRIEF DESCRIPTION OF THE DRAWINGS

FIG. 4 is a perspective view of the inventive slit valve door actuator assembly of FIG. 3, in which the assembly has been rotated so that the path of travel of the slit valve door appears to be vertical, and the assembly is shown in a configuration in which the slit valve door is extended to seal a slit valve opening (which is not shown);

FIG. 5 is a view similar to FIG. 4, but showing the inventive slit valve door actuator assembly in a configuration in which the slit valve door is retracted so as not to obstruct a slit valve opening (which is not shown);

DETAILED DESCRIPTION

In accordance with the invention, an actuator for a slit valve door is equipped with a locking mechanism, to prevent the slit valve door from being pushed away from a slit valve opening by high pressures occurring in a processing chamber sealed by the slit valve door. By providing the locking mechanism, which may include a hard stop that interacts with a feature on the slit valve's actuator shaft, it is not necessary to provide an actuator that is large enough by itself to resist the high pressure generated in the processing chamber.

An embodiment of the invention will now be described with reference to FIGS. 3–9.

Figure 1:
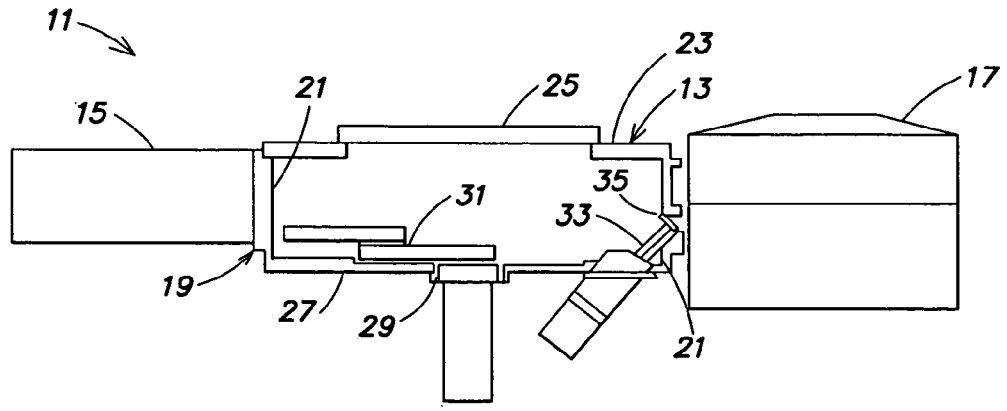
FIG. 1 is a vertical cross-sectional view of a conventional vacuum processing system in which the present invention may be applied.
Figure 2:
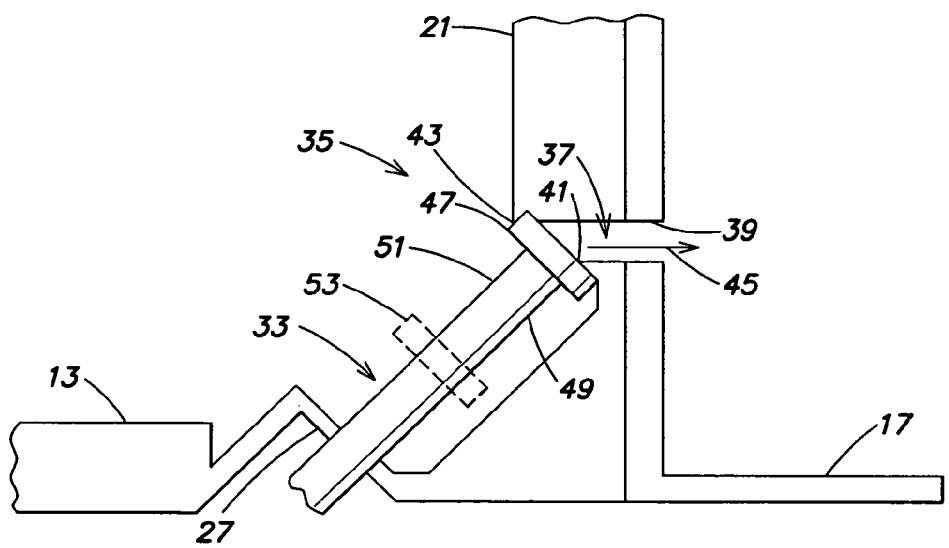
FIG. 2 is a vertical cross-sectional view showing a conventional slit valve that selectively isolates two chambers of the vacuum processing system of FIG. 1.
Figure 3:
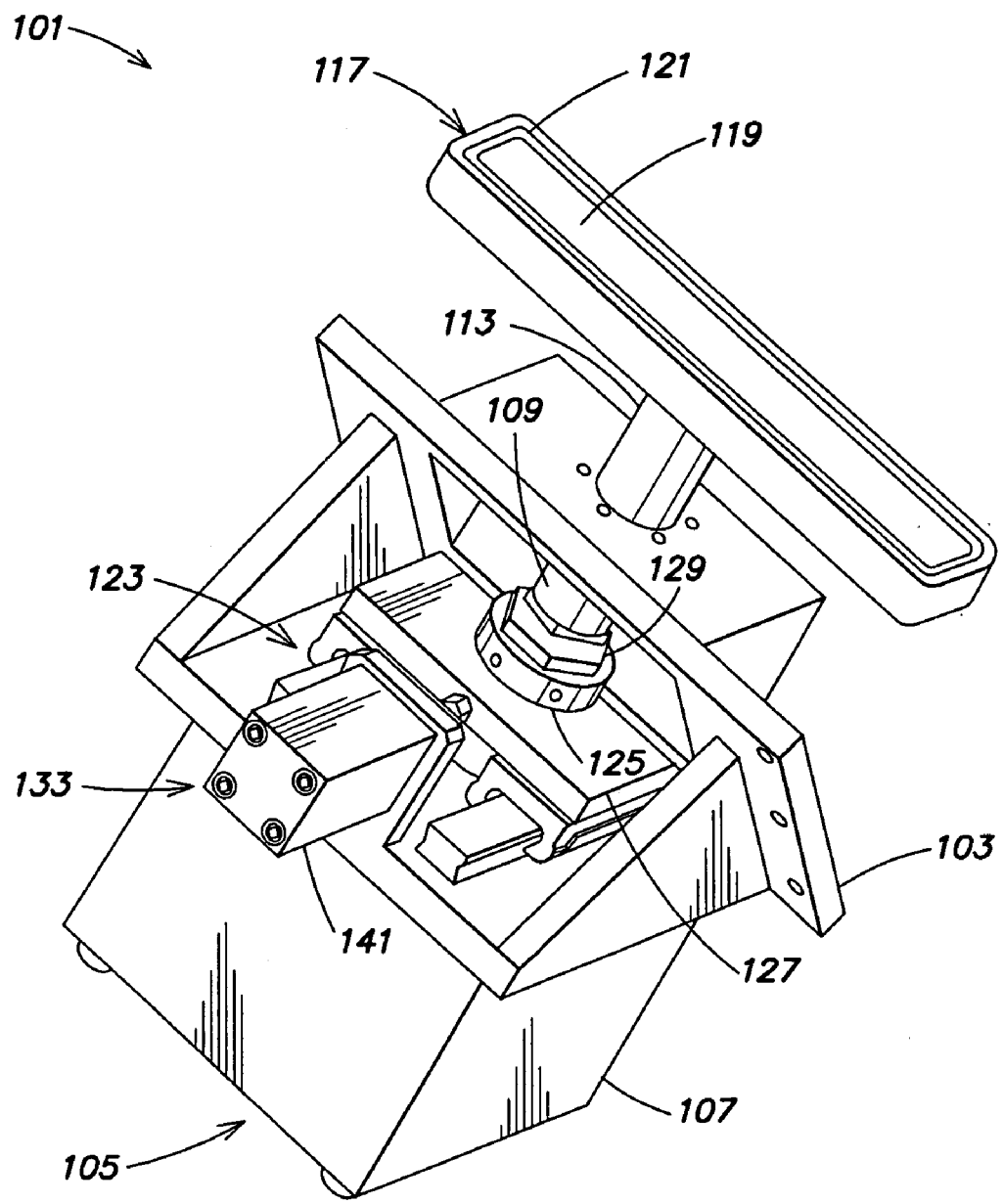
FIG. 3 is a perspective view of a slit valve door actuator assembly provided in accordance with the invention.
Figure 7:
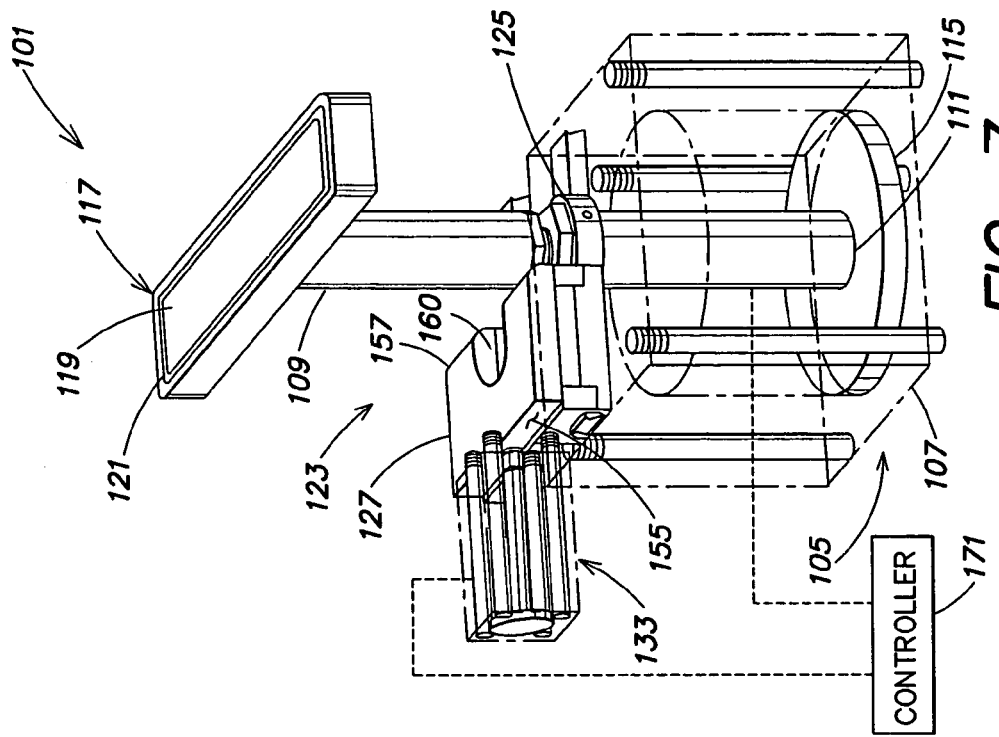
FIG. 7 is a perspective view similar to that of FIG. 6, but showing the inventive slit valve door actuator assembly positioned with the slit valve door retracted so as not to obstruct a slit valve opening (which is not shown)
Figure 6:
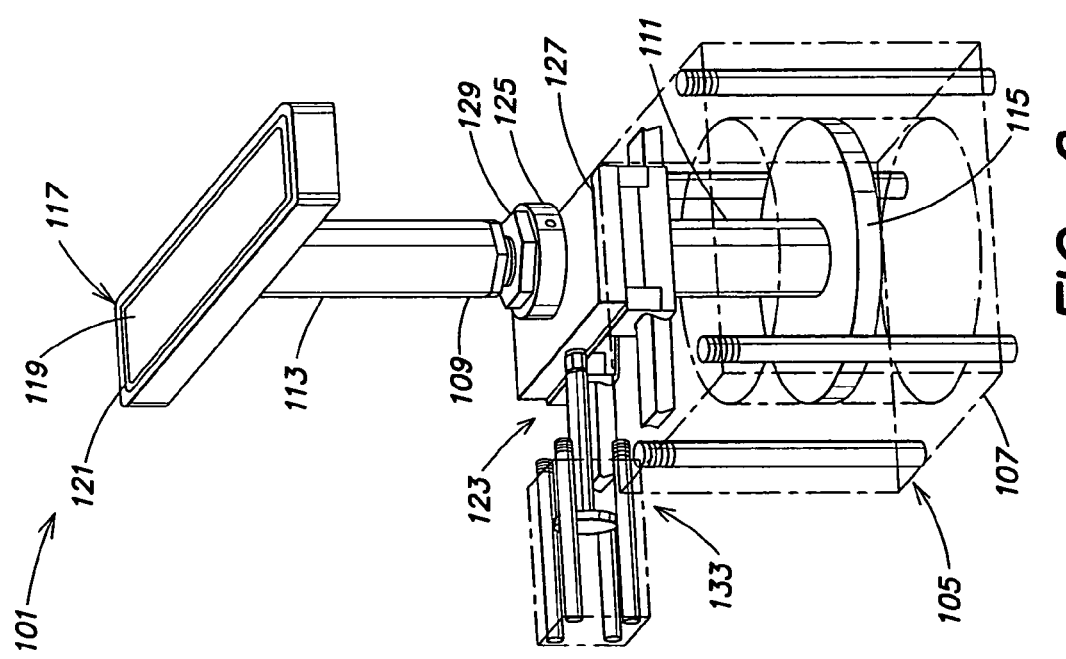
FIG. 6 is a perspective view of the inventive slit valve door actuator assembly of FIG. 3 with a mounting bracket omitted and, with the assembly rotated such that the path of travel of the slit valve door appears to be vertical, and showing the inventive slit valve assembly positioned with the slit valve door extended so as to seal a slit valve opening (which is not shown)

FIG. 3 is a perspective view of a slit valve door actuator assembly 101 provided in accordance with the invention. FIGS. 4–7 are other perspective views of the inventive slit valve door actuator assembly 101. The views presented in FIGS. 4–7 are each rotated such that the path of travel of the slit valve door appears to be vertical, whereas, in a preferred embodiment of the invention, the path of travel of the slit door valve is inclined, as in the conventional slit valve arrangement shown in FIGS. 1 and 2. The inventive slit valve door actuator assembly 101 is shown in isolation in FIGS. 3–7, but in practice the inventive slit valve door actuator assembly 101 may be installed within a conventional processing tool, as depicted in FIGS. 1 and 2 and as described in conjunction therewith. FIGS. 4 and 6 show the inventive slit valve door assembly 101 in a position such that the slit valve door seals a slit valve opening (not shown); FIGS. 5 and 7 show the inventive slit valve door assembly 101 in a position such that the slit valve door is retracted from a slit valve opening (not shown). In FIGS. 6 and 7, a mounting bracket 103 (see FIGS. 3–5) of the inventive slit valve door actuator assembly 101 is omitted to simplify the drawing.

The inventive slit valve door actuator assembly 101 may include an actuator 105 (best seen in FIGS. 6 and 7) such as a pneumatic actuator, a hydraulic actuator or the like. The actuator 105 may include an actuator housing 107 and an actuator shaft 109. The actuator shaft 109 has a first end 111 (visible, e.g., in FIGS. 5–7) and a second end 113. A pneumatic or hydraulic cylinder or the like, may be coupled to the first end 111 of the actuator shaft 109.

A slit valve door 117 is mounted on the second end 113 of the actuator shaft 109. The slit valve door 117 includes a backing plate 119 and an elastic body 121 supported on the backing plate 119. The elastic body 121 may be, for example, an O-ring. The slit valve door 117, including the backing plate 119 and the elastic body 121, may be configured in accordance with conventional practices to seal against a surface such as the surface 43 shown in FIG. 2 when the slit valve door 117 is pressed against the surface by the actuator 105. That is, the slit valve door 117 is configured to selectively sealingly close the opening 41 of the passage 37 between the transfer chamber 13 and the processing chamber 17 (see FIG. 1). It will be appreciated that the slit valve door 117 may be considered to be a sealing member and/or the elastic body 121 may be considered to include a sealing surface.

The inventive slit valve door actuator assembly 101 further includes a locking mechanism 123, which is adapted to selectively limit movement of the slit valve door 117 toward the actuator housing 107 by selectively limiting travel of the actuator shaft 109. In one embodiment of the invention, the locking mechanism 123 may include a stop feature 125 on the actuator shaft 109 such as a washer, nut or other laterally extending feature, a slot or other similar feature formed within the actuator shaft 109, or the like which may be positioned on the actuator shaft 109 at a location that is intermediate the slit valve door 117 and the actuator housing 107. The locking mechanism 123 further comprises a hard stop 127 which is selectively positionable so as to interact with the stop feature 125. Other stop features and/or stop feature and hard stop locations may be employed. For example, the stop feature could be positioned on the slit valve door (e.g., so as to extend from a backside thereof) and the hard stop positioned to selectively interact therewith.

In FIGS. 3, 4 and 6, the stop feature 125 has a circular profile and hence is disk shaped, although other shapes may be employed. A bore (not visible in the drawings) may be provided at a central portion of the stop feature 125 to receive the actuator shaft 109 therethrough. In one or more embodiments of the invention, the bore of the stop feature 125 may be threaded, or the stop feature 125 may be associated with one or more threaded features (e.g., nut 129 seen in FIGS. 3, 4, 6), and an outer surface of the actuator shaft 109 may be provided with threading (not shown) so that the position of the stop feature 125 along the actuator shaft 109 can be adjusted.

The locking mechanism 123 further includes a hard stop actuator assembly 133. The hard stop actuator assembly 133 is coupled to the hard stop 127 and is adapted to move the hard stop 127 between a blocking position, which is indicated in phantom as 135 in FIG. 8 and a release position, which is indicated as 137 in FIG. 8. The blocking position 135 may also be referred to as a first hard stop position and the release position 137 may also be referred to as a second hard stop position. When the hard stop 127 is in the blocking position 135, it obstructs a path of travel 139 (FIG. 8) of the stop feature 125. When the hard stop 127 is in the release position 137 it does not obstruct the path of travel 139 of the stop feature 125.

The hard stop actuator assembly 133 includes an actuator 141 (FIGS. 3–7) such as a pneumatic actuator, or the like. The hard stop 127 has a first side 155 (FIG. 7) and a second side 157. A slot 160 is formed in the second side 157 of the hard stop 127. The slot 160 may be configured so that the hard stop 127 partially surrounds the actuator shaft 109 when the hard stop 127 is in the blocking position 135 (see FIG. 8). Preferably, the hard stop 127 does not contact the actuator shaft 109 at any time, except for contacting the stop feature 125 as described below.

As indicated in FIG. 7, the inventive slit valve door actuator assembly 101 may include, or have associated therewith, a controller 171. The controller 171 is operatively coupled to the actuators 105 and 141 so as to control operation thereof. The controller 171 may optionally be arranged to control aspects of a processing tool (e.g., processing tool 11 of FIG. 1) in addition to the actuators 105, 141. The controller 171 may be programmed to cause a processing tool to perform the process described below in connection with FIG. 9.

Operation in accordance with the inventive slit valve door actuator assembly 101 will now be described with reference to FIG. 9, and with further reference to FIGS. 4–7. FIG. 9 is a flow chart that illustrates a process that may be performed by using a processing tool like that depicted in FIGS. 1 and 2, with the inventive slit valve door actuator assembly 101 of FIGS. 3–8 installed therein.

Prior to the beginning of the process of FIG. 9, the slit valve door 117 is in a retracted position (as shown in FIGS. 5 and 7) such that the slit valve door does not obstruct the opening of the slit valve (e.g., the opening 41 shown in FIG. 2). Consequently, the processing chamber 17 is in communication with the transfer chamber 13 via the passage 37. Also, both the transfer chamber 13 and the processing chamber 17 may be in an evacuated condition.

The process of FIG. 9 begins with a step 201, in which a substrate (not shown) to be processed in the processing chamber 17 is transferred into the processing chamber 17 from the transfer chamber 13 by the substrate handling robot 31. The robot 31 then withdraws from the processing chamber 17 leaving the substrate in the processing chamber 17, and step 203 follows. At step 203 the controller 171 (FIG. 7) controls the actuator 105 to extend the actuator shaft 109 so that the slit valve door 117, and in particular the elastic body 121, is pressed against the door seating surface 43 (FIG. 2). A seal is thereby formed around the opening 41. With substantially equal pressure in both the processing chamber 17 and the transfer chamber 13 (e.g., with both chambers evacuated), the elastic body 121 is compressed to a degree such that the backing plate 119 and the actuator shaft 109 are in a first sealing position. The slit valve door 117 may also be considered to be in a first sealing position.

Figure 8:
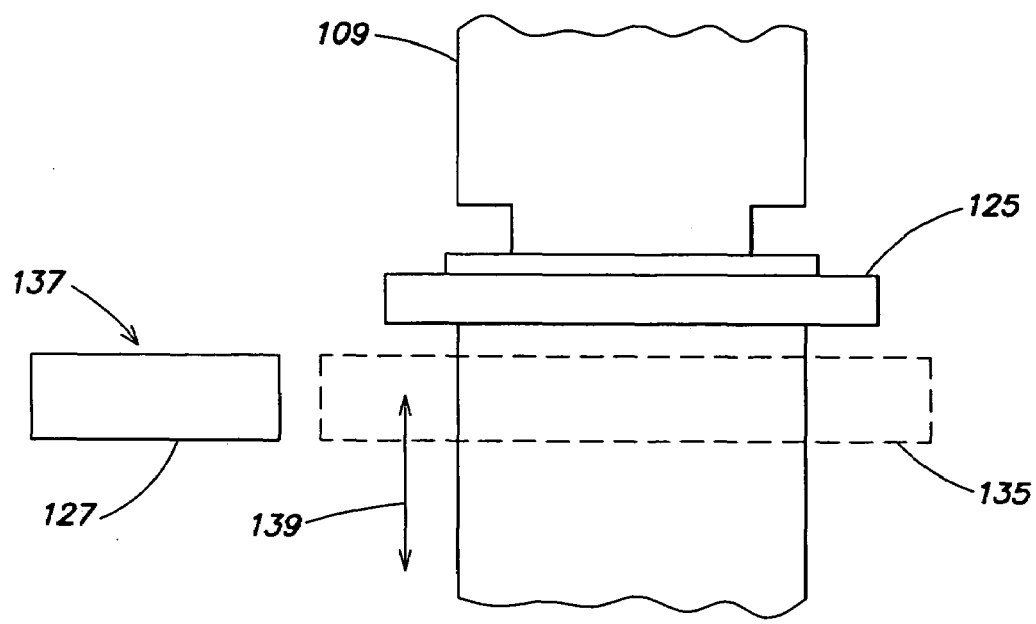
FIG. 8 is a schematic side view of the inventive slit valve door actuator assembly of FIG. 3, showing blocking and releasing positions of a hard stop relative to an actuator shaft.
Figure 9:
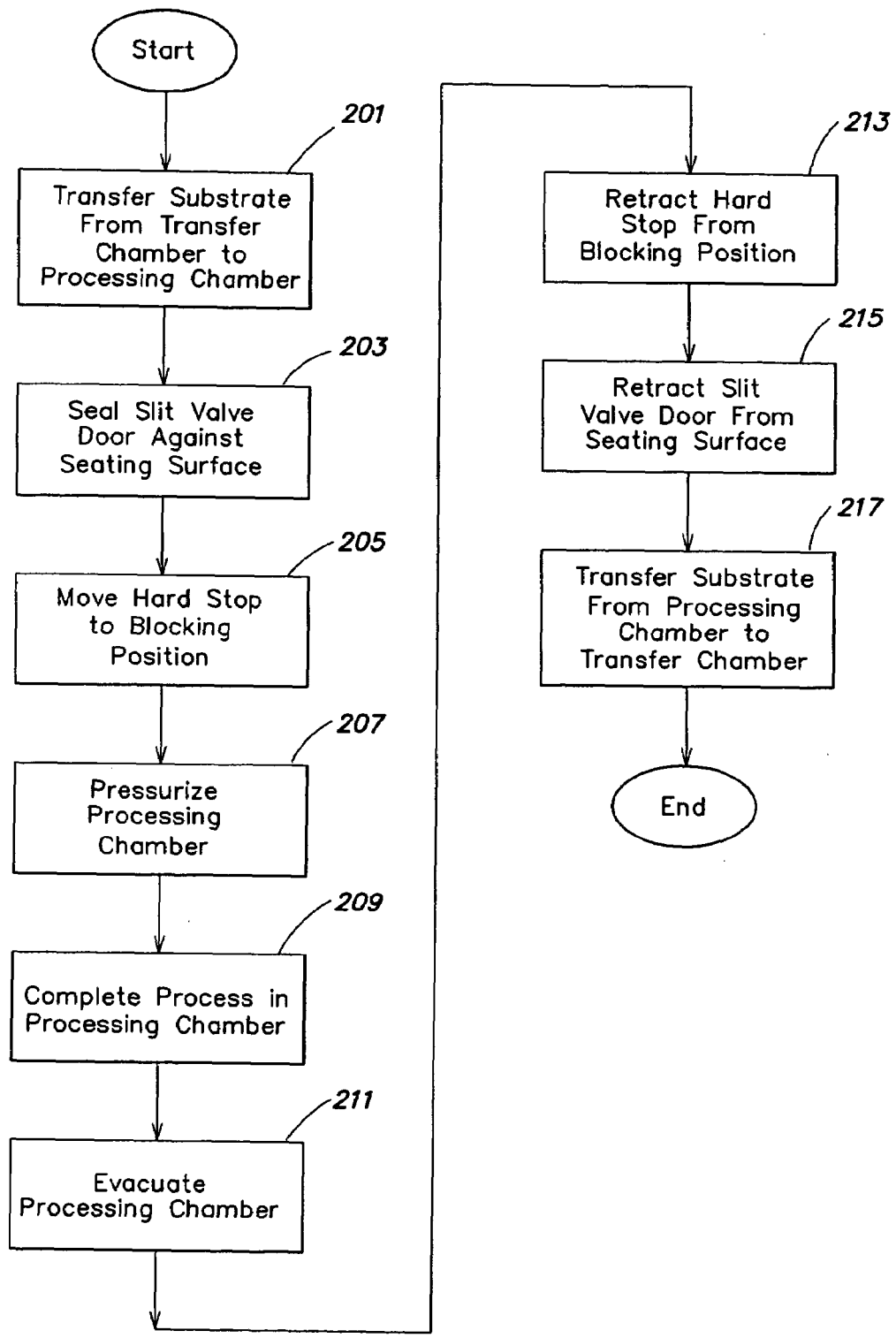
FIG. 9 is a flow chart that illustrates a method provided in accordance with the invention for operating a processing tool in which the inventive slit valve door actuator assembly is employed.

With the slit valve door 117 in the first sealing position, the stop feature 125 of the locking mechanism 123 is positioned as shown in FIG. 8, with a small clearance to allow the hard stop 127 to be moved from its release position 137 to its blocking position 135. The amount of clearance may be, for example, on the order of several mils. It will be appreciated that the position of the stop feature 125 along the actuator shaft 109 may have been adjusted during installation of the slit valve door actuator assembly 101 to provide the desired clearance.

Step 205 follows step 203. At step 205 the controller 171 controls the hard stop actuator 141 so that the hard stop 127 coupled thereto is moved from the release position 137 to the blocking position 135.

A process, such as chemical vapor deposition, etching, etc., to be performed with respect to the substrate in the processing chamber 17 may now begin. A gas pressure required for that process is provided within the processing chamber 17, as indicated by step 207. As noted above, a high gas pressure (e.g., about five atmospheres, although other pressures may be employed) may be required. The resulting pressure differential between the processing chamber 17 and the transfer chamber 13 generates a large force that is applied to the slit valve door 117 in a direction opposite to the force applied by the actuator 105. The force of the gas pressure from the processing chamber side may be sufficient to overcome the force of the actuator 105 so as to push the slit valve door 117 toward the actuator housing 107 by a small amount until the stop feature 125 contacts the hard stop 127, which is in the blocking position 135. The elastic body 121 remains compressed (although to a lesser degree than when the slit valve door 117 is in the first sealing position) and the slit valve opening 41 remains sealed by the slit valve door 117. At this time, the actuator shaft 109 and the backing plate 119 (and hence the slit valve door 117) may be considered to be in a second sealing position, in which, for example, the actuator shaft 109 extends from the actuator housing 107 by a shorter distance than when the slit valve door 117 is in the first sealing position.

The process performed within the processing chamber 17 is completed as indicated at step 209 in FIG. 9. The processing chamber 117 is then evacuated, as indicated at step 211. With evacuation of the processing chamber 117, there may be substantially no pressure differential across the slit valve door 117, and therefore no substantial force from gas pressure within the processing chamber 117 to oppose the force of the actuator 105. Accordingly, the degree of compression of the elastic body 121 may be increased, and the slit valve door 117 is returned to the first sealing position. Accordingly, the stop feature 125 may return to a position such that it no longer contacts the hard stop 127 and the clearance between the stop feature 125 and the hard stop 127 is restored.

Following step 211 is step 213. At step 213, the controller 171 controls the actuator 141 to retract the hard stop 127 coupled thereto. As a result, the hard stop 127 is retracted and moved from its blocking position 135 to its release position 137. Consequently, the hard stop 127 is no longer in the path of travel 139 (FIG. 8) of the stop feature 125. This allows the slit valve door 117 to be retracted from the door seating surface 43, as indicated at step 215. In particular, the controller 171 now controls the actuator 105 to retract the slit valve door 117. As a result, the slit valve door 117 is placed in a position (e.g., the position indicated as 53 in FIG. 2) so that the slit valve opening 41 and passage 37 are no longer obstructed thereby. The robot 31 then enters the processing chamber 17 to transfer the substrate from the processing chamber 17 to the transfer chamber 13, as represented by step 217 in FIG. 9. The process of FIG. 9 is then complete. Note that the force applied by the slit valve door actuator may be maintained throughout the process, or may be turned off after the hard stop locks the slit valve door in the closed position.

During the processing of large substrates (e.g., 300 mm), the size and geometry of the slit valve door 117, and the pressure in the processing chamber 17 may be such that the force of the processing chamber gas pressure upon the slit valve door 117 becomes very large (e.g., about 1,500 lbs. or more against the actuator 105 if a large pressure differential exists across the slit valve door 117, such as when a processing chamber gas pressure of about 5 ATM or more is employed). The stop feature 125 and the hard stop 127 are dimensioned, and are constructed of materials selected, such that the locking mechanism 123 is able to hold the slit valve door 117 at the second sealing position, not withstanding the large force applied to the slit valve door 117 by the gas pressure inside the processing chamber 17. In one such embodiment, even though a force of about 1,500 lbs. or more may be applied against the actuator 105 (due to a large pressure within the processing chamber 17), the actuator 105 coupled to the slit valve door 117 has a bore diameter (B.D.) of about 2 inches, and only exerts a force necessary to obtain an adequate degree of compression of the elastic body 121 to place the slit valve door 117 in the first sealing position. By way of comparison, if the locking mechanism 123 were not provided, it might be necessary to provide a pneumatic actuator having a B.D. of greater than 5 inches to produce a force sufficient to maintain the slit valve door 117 in place against the gas pressure inside the processing chamber 17. The actuator 105 may comprise, for example, a conventional pneumatic or other similar actuator. The hard stop actuator 141 may have, for example, about a one inch B.D., and also may be a conventional actuator. Other bore diameters may be employed. As an alternative to a pneumatic actuator, other types of actuators may be employed, including, for example, a hydraulic actuator or a motor driven arrangement (e.g., a lead screw or other connecting structure that couples the motor to the hard stop 127).

Instead of employing a conventional O-ring as the elastic body 121, other arrangements may be provided, including a molded-in-place seal such as that disclosed in U.S. Pat. No. 6,089,543, which is incorporated herein in its entirety by this reference. The backing plate 119 may comprise one or more members, and may assume other shapes for supporting the elastic body 121. The stop feature 125 and the hard stop 127 may have other configurations than those illustrated herein.

The feature on the actuator shaft 109 with which the hard stop 127 interacts need not extend outwardly from the shaft diameter. For example, the feature may be a notch, a step, or a circumferential channel adapted to be engaged by the hard stop.

The foregoing description discloses only exemplary embodiments of the invention; modifications of the above disclosed apparatus which fall within the scope of the invention will be readily apparent to those of ordinary skill in the art. For example, the transfer chamber in which the inventive slit valve door actuator assembly may be installed may have a domed bottom, as disclosed in U.S. Provisional Patent Application Ser. Nos. 60/390,629 and 60/392,578 rather than the generally flat transfer chamber bottom illustrated in FIG. 2 hereof. The above-referenced commonly-owned provisional patent applications are hereby incorporated by reference herein in their entirety.

Although the inventive locking mechanism 123 illustrated above is associated with a central portion of the actuator shaft 109 of the slit valve door actuator 105, other locking mechanism arrangements may be provided in accordance with the invention. For example, an alternative locking mechanism may include one or more stop members that extend within the actuator housing 107 and that selectively prevent the pressure disk 115 from moving in the direction away from the seating surface 43 when the slit valve door 117 is pressed against the seating surface 43. Other alternative embodiments of the locking mechanism may also be provided.

Accordingly, while the present invention has been disclosed in connection with exemplary embodiments thereof, it should be understood that other embodiments may fall within the spirit and scope of the invention, as defined by the following claims.

The invention claimed is:

1. An apparatus comprising:
   a slit valve door adapted to seal a slit valve opening;
   an actuator coupled to the slit valve door and adapted to selectively move the slit valve door between a closed position in which the slit valve door seals the slit valve opening, and an open position in which the slit valve door does not seal the slit valve opening;
   a hard stop adapted to selectively move between a lock position in which the hard stop locks the slit valve door in the closed position and unlock position in which the hard stop allows the slit valve door to move between the closed position and the open position; and a controller coupled to the actuator and to the hard stop, and adapted to cause the actuator to move the slit valve door to the closed position and thereafter to cause the hard stop to move to the lock position so as to lock the slit valve door in the closed position;

wherein the controller is adapted to cause a first compression between the slit valve door and the slit valve when the slit valve door is in the closed position and the hard stop has not yet locked the slit valve door in the closed position, and to cause a second compression between the slit valve door and the slit valve opening when the hard stop has locked the slit valve door in the closed position; and wherein the second compression is less than the first compression.

2. The apparatus of claim 1 wherein the actuator comprises a stop feature, and wherein the hard stop contacts the stop feature to lock the slit valve door in the closed position.

3. The apparatus of claim 2 wherein the actuator comprises a shaft, and the stop feature is located on the shaft.

4. The apparatus of claim 3 wherein the controller is further adapted to:
(a) cause the actuator to move the slit valve door to a first closed position wherein the stop feature is beyond a surface of the hard stop that is closest to the slit valve opening;
(b) thereafter to cause the hard stop to move to the lock position; and
(c) thereafter allow the actuator to move the slit valve door to a second closed position wherein the stop feature contacts the hard stop and is thereby prevented from further movement.

5. The apparatus of claim 2 wherein the controller is further adapted to:
(a) cause the actuator to move the slit valve door to a first closed position wherein the stop feature is beyond a surface of the hard stop that is closest to the slit valve opening;
(b) thereafter to cause the hard stop to move to the lock position; and
(c) thereafter allow the actuator to move the slit valve door to a second closed position wherein the stop feature contacts the hard stop and is thereby prevented from further movement.

6. An apparatus comprising:
a slit valve door adapted to seal a slit valve opening;
an actuator coupled to the slit valve door and adapted to selectively move the slit valve door between a closed position in which the. slit valve door seals the slit valve opening, and an open position in which the slit valve door does not seal the slit valve opening;
a hard stop adapted to selectively move between a lock position in which the hard stop locks the slit valve door in the closed position and unlock position in which the hard stop allows the slit valve door to move between the closed position and the open position; and
a controller coupled to the actuator and to the hard stop, and adapted to cause the actuator to move the slit valve door to the closed position and thereafter to cause the hard stop to move to the lock position so as to lock the slit valve door in the closed position;
wherein the closed position in which the slit valve door seals the slit valve opening comprises a first closed position in which a first compression exists between the slit valve door and the slit valve opening, and a second closed position in which a second compression exists between the slit valve door and the slit valve opening; and wherein the first closed position occurs before the hard stop is moved to the lock position, and the second closed position occurs after the hard stop is moved to the lock position, and the first compression is greater than the second compression.

7. The apparatus of claim 6 further comprising a stop feature adapted to contact the hard stop when the hard stop is in the lock position.

8. The apparatus of claim 7 wherein the position of the stop feature relative to the slit valve door is adjustable.

9. The apparatus of claim 6 further comprising a stop feature adapted to contact the hard stop when the hard stop is in the lock position.

10. The apparatus of claim 9 wherein the position of the stop feature relative to the slit valve door is adjustable.

11. A system comprising:
a transfer chamber adapted to transport substrates in a first environment having a first pressure;
a processing chamber adapted to process substrates in a second environment having a second pressure that is higher than the first pressure;
a slit valve opening located between the transfer chamber and the processing chamber such that a substrate may be transferred between the transfer chamber and the processing chamber via the slit valve opening;
a slit valve door adapt to seal a slit valve opening;
an actuator coupled to the slit valve door and adapted to selectively move the slit valve door between a closed position in which the slit valve door seals the slit valve opening, and an open position in which the slit valve door does not seal the slit valve opening;
a hard stop adapted to selectively move between a lock position in which the hard stop locks the slit valve door in the closed position and unlock position in which the hard stop allows the slit valve door to move between the closed position and the open positions; and
a controller coupled to the actuator and to the hard stop, and adapted to cause the actuator to move the slit valve door to the closed position and thereafter to cause the hard stop to move to the lock position so as to lock the slit valve door in the closed position;
wherein the controller is adapted to cause a first compression between the slit valve door and the slit valve when the slit valve door is in the closed position and the hard stop has not yet locked the slit valve door in the closed position, and to cause a second compression between the slit valve door and the slit valve opening when the hard stop has locked the slit valve door in the closed position; and wherein the second compression is less than the first compression.

12. A method comprising:
moving a slit valve door to a closed position in which the slit valve door seals a slit valve opening; and
moving a hard stop into a lock position in which the hard stop prevents the slit valve door from unsealing the slit valve opening;
wherein moving the slit valve door to the closed position comprises moving the slit valve door to a first closed position and generating a first compression between the slit valve door and the slit valve opening; and the method further comprises allowing the slit valve door to move to a second closed position in which the hard stop prevents the slit valve door from unsealing the slit valve opening and thereby generating a second compression between the slit valve door and the slit valve opening, wherein the first compression is greater than the second compression.

13. The method of claim 12 further comprising generating a pressure differential across the slit valve door.

14. The method of claim 13 wherein the pressure differential is approximately five atmospheres or greater.

* * * * *